(12) United States Patent
Lee et al.

(10) Patent No.: US 8,835,894 B2
(45) Date of Patent: Sep. 16, 2014

(54) RESISTIVE MEMORY STRUCTURE AND METHOD FOR FABRICATING THE SAME

(75) Inventors: Ming-Daou Lee, Chiayi (TW); ChiaHua Ho, Hsinchu (TW); Cho-Lun Hsu, Hsinchu (TW); Wen-Cheng Chiu, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 14 days.

(21) Appl. No.: 13/452,544

(22) Filed: Apr. 20, 2012

(65) Prior Publication Data
US 2013/0221313 A1    Aug. 29, 2013

(30) Foreign Application Priority Data
Feb. 24, 2012 (TW) .............................. 101106428 A

(51) Int. Cl.
 *H01L 47/00* (2006.01)
(52) U.S. Cl.
 USPC .................................. 257/4; 257/5; 438/129
(58) Field of Classification Search
 USPC ................. 257/4, 43; 438/129, 237, 295, 652
 See application file for complete search history.

(56) References Cited

U.S. PATENT DOCUMENTS

| 6,617,627 | B2 * | 9/2003 | Natori et al. | 257/295 |
| 6,861,687 | B2 * | 3/2005 | Hsu et al. | 257/295 |
| 2005/0254291 | A1 * | 11/2005 | Happ et al. | 365/163 |
| 2007/0205456 | A1 * | 9/2007 | Lee et al. | 257/314 |
| 2009/0095985 | A1 * | 4/2009 | Lee et al. | 257/211 |
| 2012/0097915 | A1 * | 4/2012 | Mikawa et al. | 257/4 |

FOREIGN PATENT DOCUMENTS

| TW | I284899 | 12/2005 |
| TW | I322993 | 4/2010 |
| TW | I323928 | 4/2010 |
| TW | I332249 | 10/2010 |
| TW | I335073 | 12/2010 |

OTHER PUBLICATIONS

Hosoi, Y., et al., "High Speed Unipolar Switching Resistance RAM (RRAM) Technology", i Technical Disgest-International Electron Devices Meeting, IEDM, 4154333, (2006), 5 pages.

* cited by examiner

*Primary Examiner* — Errol Fernandes
(74) *Attorney, Agent, or Firm* — Muncy, Geissler, Olds & Lowe, P.C.

(57) ABSTRACT

The present invention discloses a resistive memory structure and a method for fabricating the same. The memory structure comprises a plurality of memory cells. Each memory cell further comprises two separate upper sub-electrodes fabricated from an upper electrode, two separate lower sub-electrodes fabricated from a lower electrode and intersecting the upper sub-electrodes, and a resistive layer arranged between the upper sub-electrodes and the lower sub-electrodes. Thereby, four sub-memory cells are formed in the intersections of the two upper sub-electrodes, the two lower sub-electrodes, and the resistive layer. Thus is increased the density of a memory structure in an identical area.

16 Claims, 15 Drawing Sheets

RESISTIVE MEMORY STRUCTURE AND METHOD FOR FABRICATING THE SAME

BACKGROUND OF THE INVENTION

1. Field of the Invention

The present invention relates to a resistive memory structure and a method for fabricating the same, particularly to an ultra high density resistive memory structure having a quadruple memory density in an identical area.

2. Description of the Related Art

Advanced memories are emerging persistently, such as PCRAM (Phase Change Random Access Memory), MRAM (Magnetic Random Access Memory) and RRAM (Resistive Random Access Memory). Featuring high read/write speed, non-destructive reading, durability to extreme temperature, high integration with related circuits, RRAM is regarded as a memory potential to replace all the existing ones.

RRAM also has advantages of high density, low cost, low power consumption, superior data retention ability, and simple structure. Refer to FIG. 1 schematically showing an array structure of a conventional RRAM. The conventional RRAM comprises a plurality of first metal lines 10 functioning as bit lines and a plurality of second metal lines 12 functioning as word lines. The first metal lines 10 intersect the second metal lines 12. An insulating layer 14 is arranged between the first metal lines 10 and the second metal lines 12. Thus is formed a memory cell 16 in each intersection of the first metal lines 10 and the second metal lines 12.

The quantity of the memory cells 16 depends on the quantities of the first metal lines 10 and second metal lines 12. For example, there are 21 memory cells 16 if there are 7 first metal lines 10 in columns and 3 second metal lines 12 in rows. The principle of RRAM is that a voltage is applied to the first and second metal lines 10 and 12 to transform the insulating layer 14 from a high-resistance state to a low-resistance state or from a low-resistance state to a high-resistance state.

Because of market demand and technical evolution, the size of elements has reduced from microns to nanometers (1-100 nm). Suppose that the minimum feature size is 90 nm and denoted with F. In a conventional RRAM, the first metal line 10 has a width of 1 F, and the spacing between two adjacent first metal lines 10 is also 1 F. Thus, one first metal line 10 and the spacing thereof have a total width of 2 F. The second metal line 12 has a width of 1 F, and the spacing between two adjacent second metal lines 12 is also 1 F. Thus, one second metal line 12 and the spacing thereof also have a total width of 2 F. Therefore, the conventional RRAM has a minimum cell area of 4 $F^2$. The scalability of such a memory structure has reached a physical limit. The density of a memory is unlikely to increase except the structures thereof are stacked up vertically. Nevertheless, the stacked memory structure is still hard to meet the demand for a high-capacity small-volume memory. Therefore, how to increase the memory density in a minimum memory area is a problem the manufacturers are eager to overcome.

SUMMARY OF THE INVENTION

The primary objective of the present invention is to provide a resistive memory structure and a method for fabricating the same, wherein a photolithography-etching process is used to divide an electrode into two sub-electrodes to double the quantities of bit lines and word lines, whereby is quadrupled the density of memory cells, and whereby the present invention can use the 90 nm process to fabricate the memory structure having the same capacity as the memory structure fabricated in the 45 nm process, and whereby the density of a memory leaps ahead by two generations.

Another objective of the present invention is to provide a resistive memory structure and a method for fabricating the same, wherein the structures of a memory is stacked up vertically to increase the capacity of the memory.

To realize the abovementioned objectives, the present invention proposes a resistive memory structure, which comprises a plurality of memory cells. Each memory cell further comprises an upper electrode, a lower electrode, and a resistive layer. The upper electrode includes two separate upper sub-electrodes. The lower electrode includes two separate lower sub-electrodes. The two upper sub-electrodes intersect the two lower sub-electrodes. The resistive layer is arranged between the upper sub-electrodes and the lower sub-electrodes. Thereby, four sub-memory cells are formed in the intersections of the two upper sub-electrodes and the two lower sub-electrodes.

The present invention also proposes a method for fabricating a resistive memory structure, which comprises steps: providing a substrate; forming a dielectric layer on the substrate; forming two separate first lower dielectric layers on the dielectric layer with a photolithography-etching process; forming two separate lower sub-electrodes over the dielectric layer and respectively on sidewalls of the two first lower dielectric layers; forming a second lower dielectric layer over the dielectric layer and inside a gap between the two lower sub-electrodes; removing a portion of the two lower sub-electrodes and a portion of the two first lower dielectric layers to form two first openings respectively at two opposite sides of the second lower dielectric layer to make the two lower sub-electrodes independently controlled; forming two third lower dielectric layers respectively inside the two first openings and flattening the two third lower dielectric layers; forming a resistive layer over the two first lower dielectric layers, the two lower sub-electrodes, the second lower dielectric layer, and the two third lower dielectric layers; forming on the resistive layer two separate first upper dielectric layers intersecting the two first lower dielectric layers to present a cross-like shape; forming two separate upper sub-electrodes over the resistive layer and respectively on sidewalls of the two first upper dielectric layers; forming a second upper dielectric layer over the resistive layer and inside a gap between the two upper sub-electrodes; removing a portion of the two upper sub-electrodes and a portion of the two first upper dielectric layers to form two second openings respectively at two opposite sides of the second upper dielectric layer to make the two upper sub-electrodes independently controlled; and forming two third upper dielectric layers respectively inside the two second openings to facilitate the process of stacking memory cells. The present invention quadruples the capacity of a memory structure in the same area, using the 90 nm process to fabricate the upper electrode into two upper sub-electrodes and the lower electrode into two lower sub-electrodes.

Below, embodiments are described in detail to make easily understood the objectives, technical contents, characteristics and accomplishments of the present invention.

DETAILED DESCRIPTION OF THE INVENTION

With emerging portable electronics and persistent function upgrade, the global memory market is also growing fast. Under a situation that the feature size of semiconductor is unlikely to reduce anymore, the Inventors have been devoted to research and development and finally propose an ultra high density resistive memory structure to further increase the capacity of a memory in an identical area, whereby to satisfy the demand for higher capacity memories and meet the trend toward compact and slim products.

Figure 1:
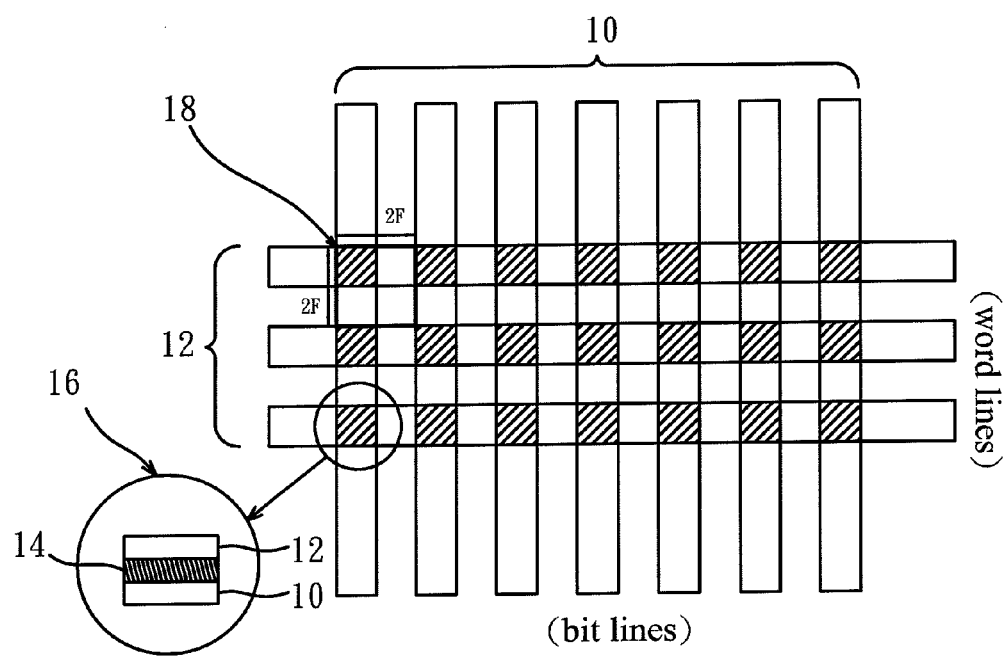
FIG. 1 schematically shows an array structure of a conventional RRAM.
Figure 2:
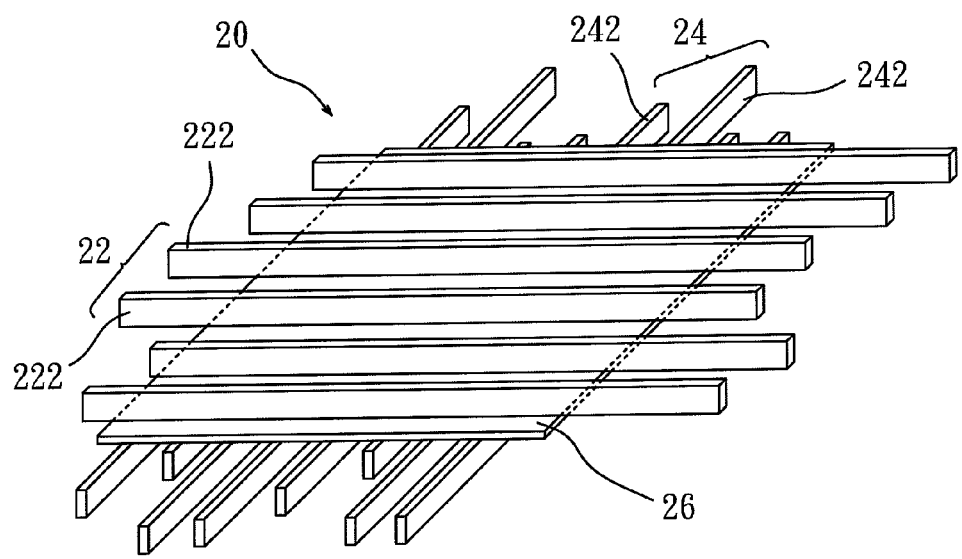
FIG. 2 is a perspective view schematically showing a resistive memory structure according to one embodiment of the present invention.
Figure 3:
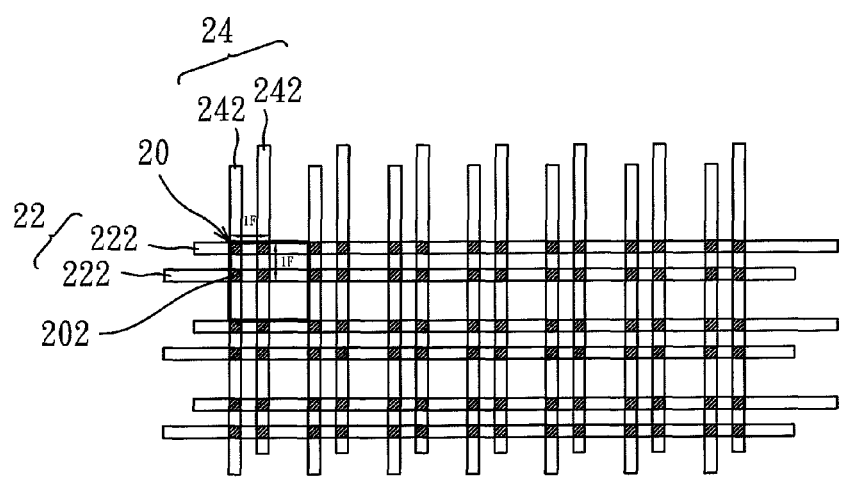
FIG. 3 is a top view schematically showing a resistive memory structure according to one embodiment of the present invention.

Refer to FIG. 2 and FIG. 3 respectively a perspective view and a top view of a resistive memory structure according to one embodiment of the present invention. The ultra high density resistive memory structure of the present invention comprises a plurality of memory cells 20. Each memory cell 20 further comprises an upper electrode 22, a lower electrode 24 and a resistive layer 26. In this embodiment, the memory having a feature size of 90 nm is improved to increase the density thereof. The lower electrode 24 has two separate lower sub-electrodes 242. In other words, the original lower electrode 24 having a width of 1 F is fabricated into two separate lower sub-electrodes 242, and the two lower sub-electrodes 242 and the gap therebetween totally have a width of 1 F. The resistive layer 26 is arranged over the lower electrode 24. The upper electrode 22 is laid over the resistive layer 26 and arranged to intersect the lower electrode 24. The upper electrode 22 has two separate upper sub-electrodes 222. In other words, the original upper electrode 22 having a width of 1 F is fabricated into two separate upper sub-electrodes 222, and the two upper sub-electrodes 222 and the gap therebetween totally have a width of 1 F. The resistive layer 26 is interposed between the upper electrode 22 and the lower electrode 24. Thus, the intersections of the two upper sub-electrodes 222 and the two lower sub-electrodes 242 form four sub-memory cells 202. Therefore, the present invention can fabricate memory cells having an area of 1 $F^2$, which is much smaller than 4 $F^2$ the area of the memory cells of the conventional RRAM. Refer to FIG. 1 again. The conventional RRAM has 7 first metal lines 10 (the lower electrodes) and 3 second metal lines 12 (the upper electrodes). Thus, the conventional RRAM has 21 memory cells. In the same area of the memory structure of the present invention, the quantity of the lower sub-electrodes 242 is 14, which is the double of the quantity of the first metal lines 10; the quantity of the upper sub-electrodes 222 is 6, which is also the double of the quantity of the second metal lines 12. Thus, the memory structure of the present invention has 84 memory cells 202, which are quadruple the memory cells of the conventional RRAM in the same area. Therefore, the present invention can use the 90 nm process to fabricate the memory structure having the same capacity as the memory structure fabricated in the 45 nm process.

Figure 4A:
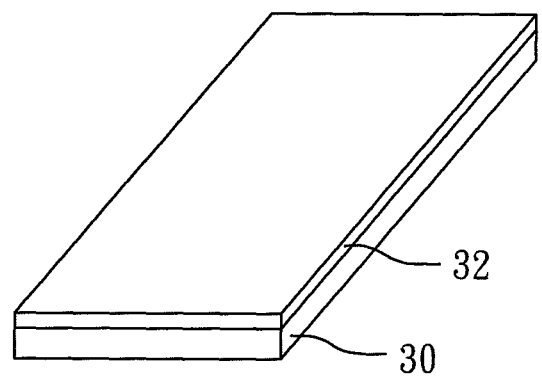
FIGS. 4A-4R schematically show the steps of a method for fabricating a resistive memory structure according to one embodiment of the present invention.
Figure 4B:
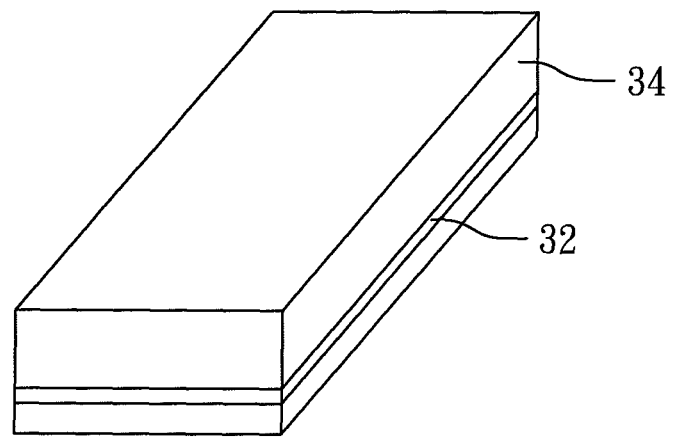
Figure 4C:
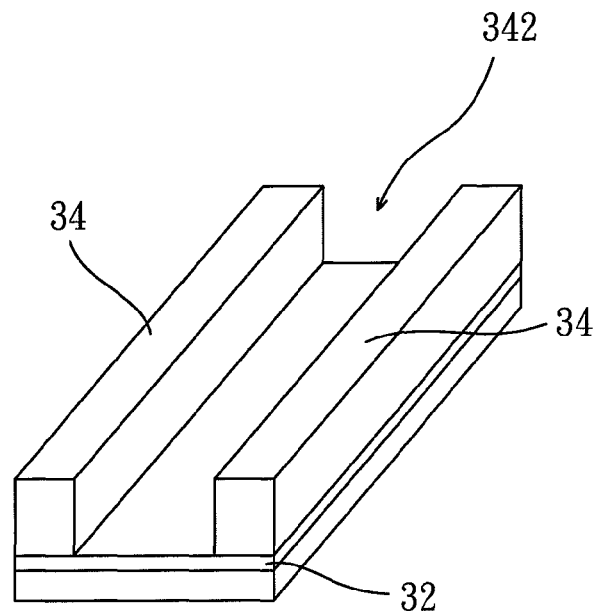
Figure 4D:
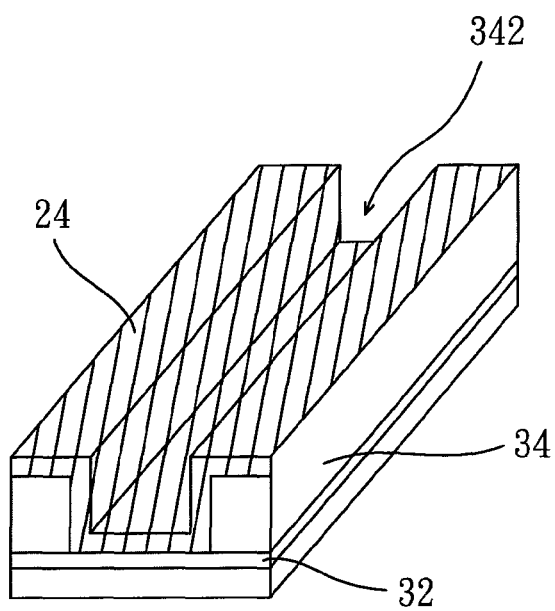
Figure 4E:
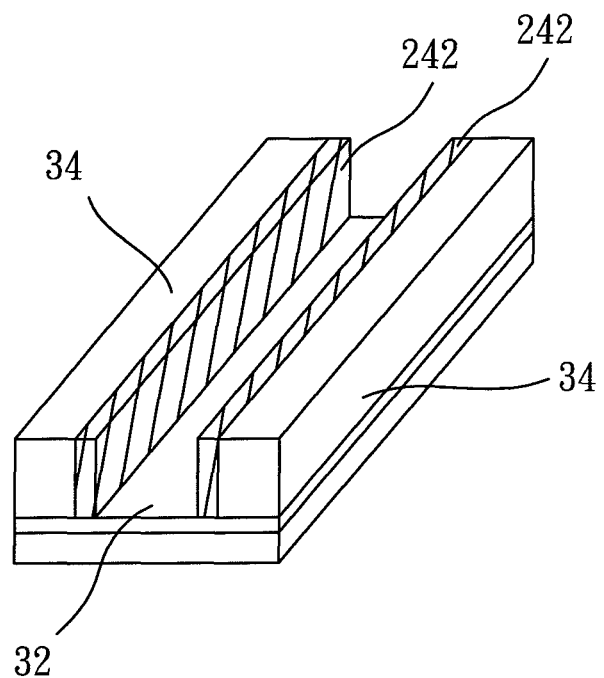
Figure 4F:
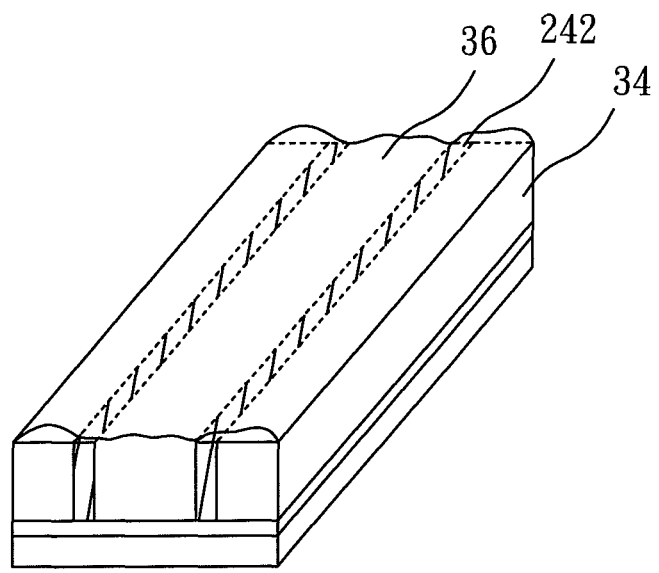
Figure 4G:
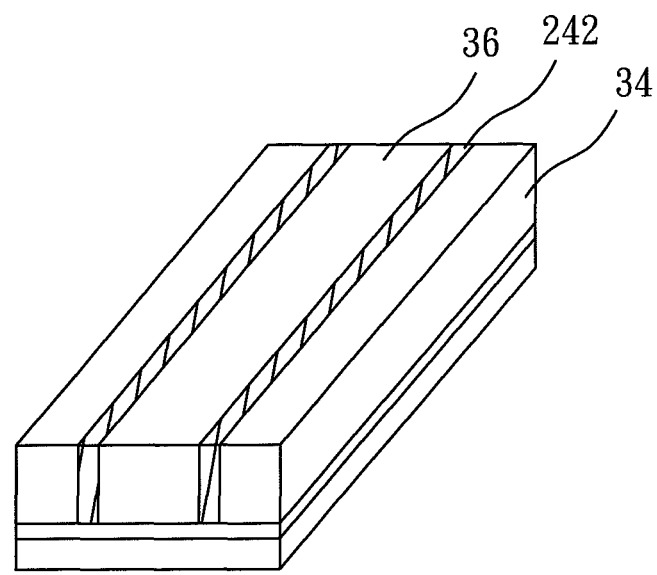
Figure 4H:
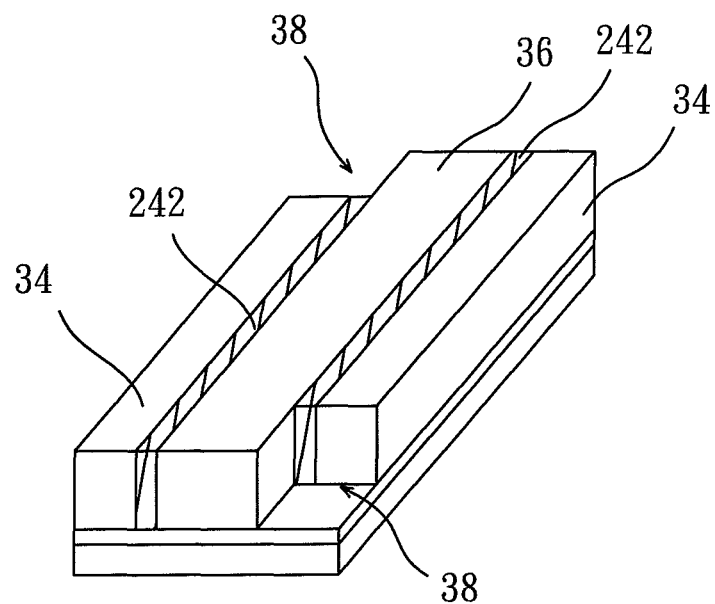
Figure 4R:
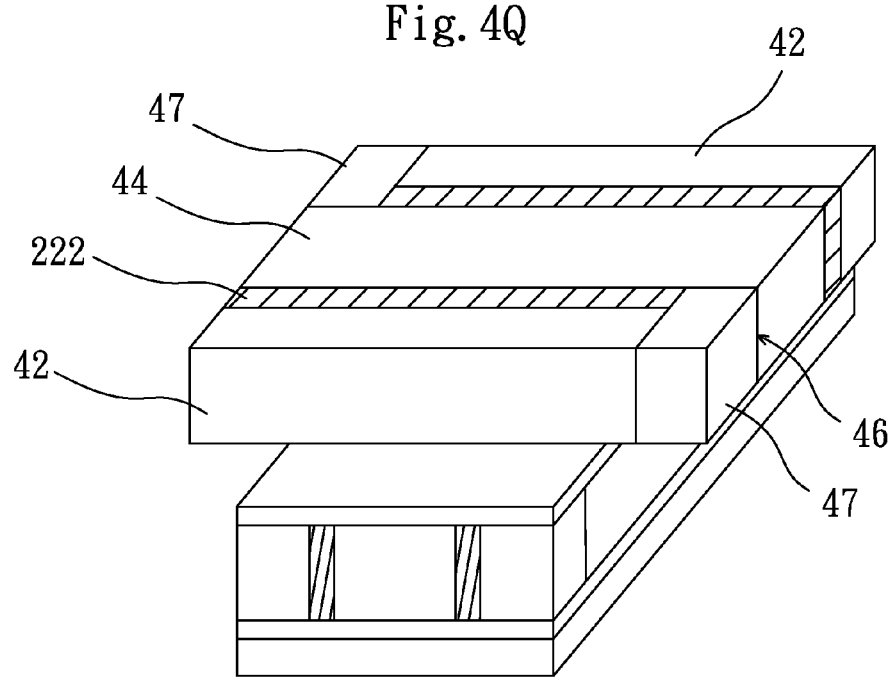
Figure 5A:
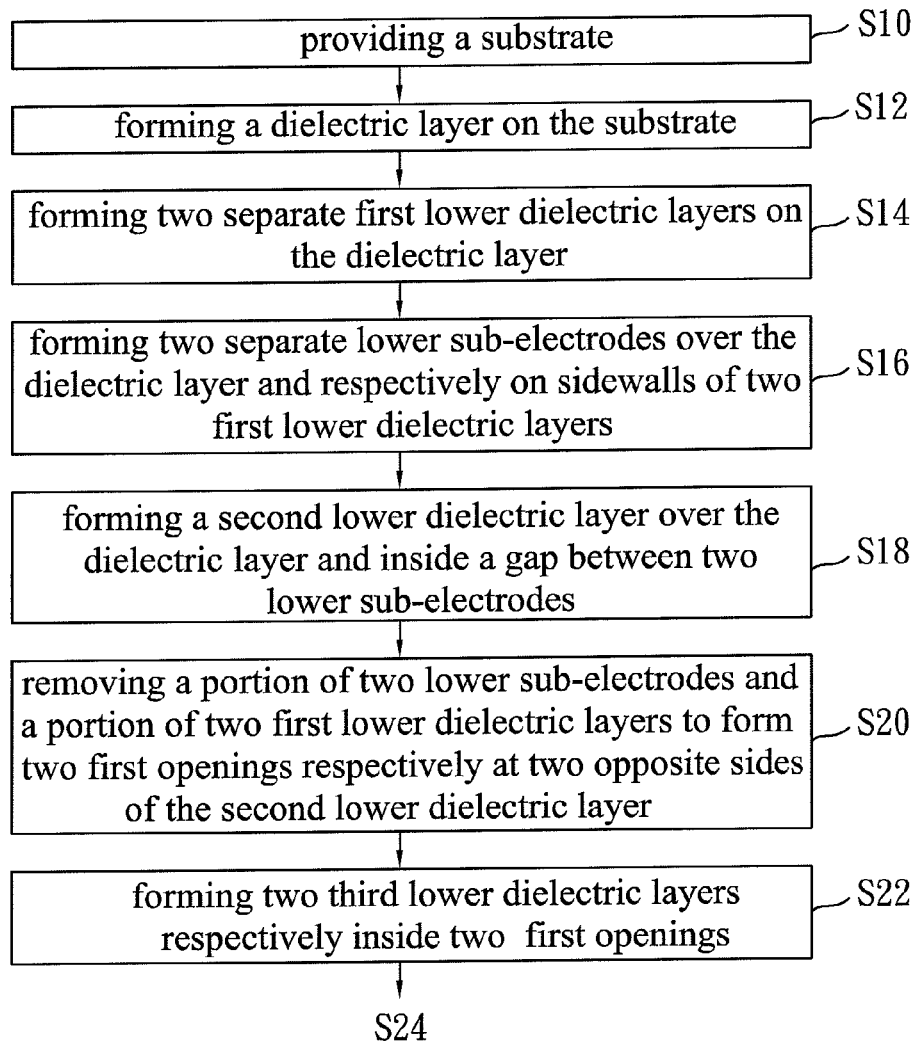
FIG. 5A-5B shows a flowchart of a method for fabricating a resistive memory structure according to one embodiment of the present invention.
Figure 5B:
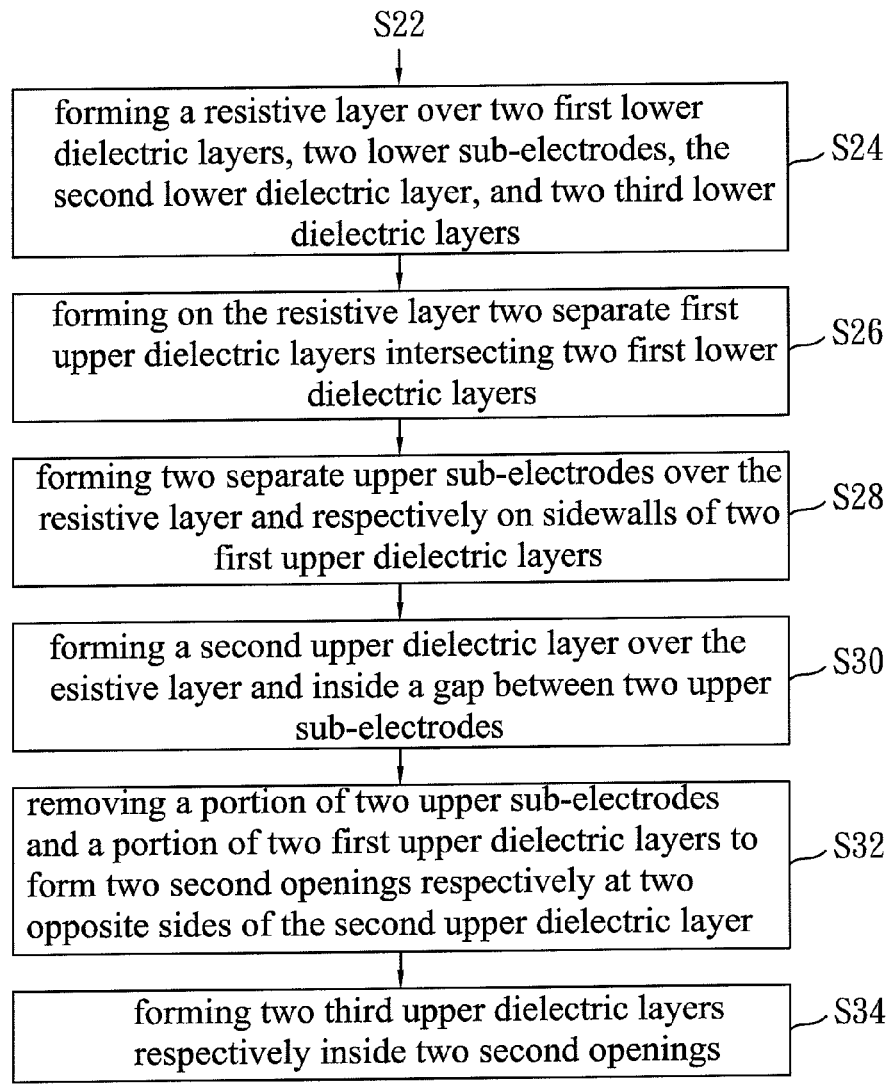

Below is introduced a method for fabricating a resistive memory structure of the present invention. Refer to FIGS. 4A-4R and FIG. 5A-5B. FIGS. 4A-4R schematically show the steps of a method for fabricating a resistive memory structure according to one embodiment of the present invention. FIG. 5A-5B shows a flowchart of a method for fabricating a resistive memory structure according to one embodiment of the present invention. In Step S10, provide a substrate 30, such as a substrate made of silicon. In Step S12, form a dielectric layer 32 (such as a dielectric layer made of silicon dioxide ($SiO_2$)) on the substrate 30, as shown in FIG. 4A. In Step S14, form a complete layer of a first lower dielectric layer 34 (made of such as silicon nitride (SiN)) on the dielectric layer 32, as shown in FIG. 4B; next, use a photolithography-etching process to form a trench 342 in the middle of the first lower dielectric layer 34 to generate two separate first lower dielectric layers 34 on the dielectric layer 32, as shown in FIG. 4C. In Step S16, form a complete layer of a lower electrode 24 over the first lower dielectric layer 34 and the dielectric layer 32 inside the trench 342 with a CVD (Chemical Vapor Deposition) method, a PVD (Physical Vapor Deposition) method, or an ALD (Atomic Layer Deposition) method, as shown in FIG. 4D; next, use an RIE (Reactive Ion Etching) process and one of chlorine, argon and hydrogen bromide to remove the lower electrode 24 on the first lower dielectric layer 34 and a portion of the lower electrode 24 inside the trench 342 to form two separate lower sub-electrodes 242 above the dielectric layer 32 and respectively on two sidewalls of two separate first lower dielectric layers 34, as shown in FIG. 4E. The preferred width of the lower sub-electrode 24 is 1-10 nm.

In Step S18, use a CVD method to form a second lower dielectric layer 36 over the dielectric layer 32 inside the gap between the two separate lower sub-electrodes 242. The second lower dielectric layer 36 is made of silicon dioxide or silicon nitride. As shown in FIG. 4F, the as-deposited second lower dielectric layer 36 is rugged. Therefore, a CMP (Chemical Mechanical Polishing) method is used to flatten the as-deposited second lower dielectric layer 36 and make the top of the second lower dielectric layer 36 and the top of two lower sub-electrodes 242 on the same plane, as shown in FIG. 4G. In Step S20, use a photolithographic process (such as a photomask process) and an etching process (such as an RIE process) to remove a portion of two lower sub-electrodes 242 and a portion of two first lower dielectric layers 34 to form two first openings 38 respectively at two opposite sides of the second lower dielectric layer 36, as shown in FIG. 4H. Thereby, the two lower sub-electrodes 242 are disconnected electrically and can be controlled independently. The description of the abovementioned steps demonstrates that the present invention can fabricate two lower sub-electrodes 242 in a dimension of 1 F.

Figure 4I:
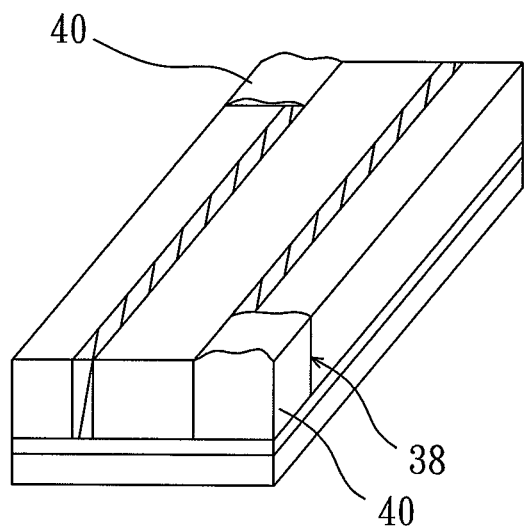
Figure 4J:
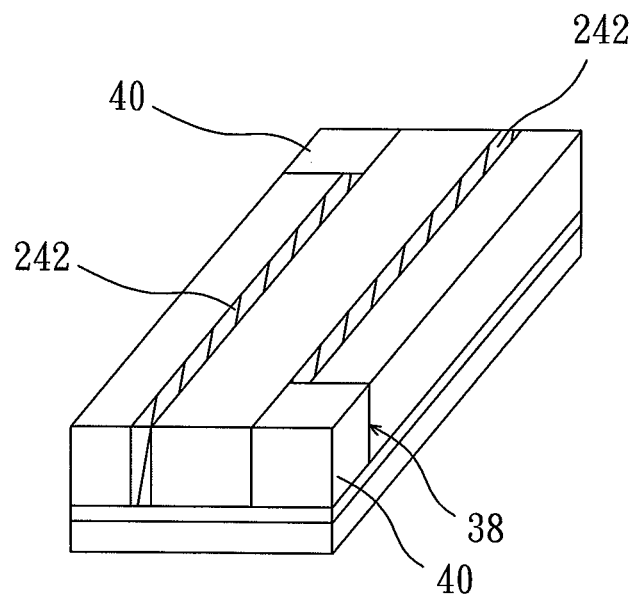
Figure 4K:
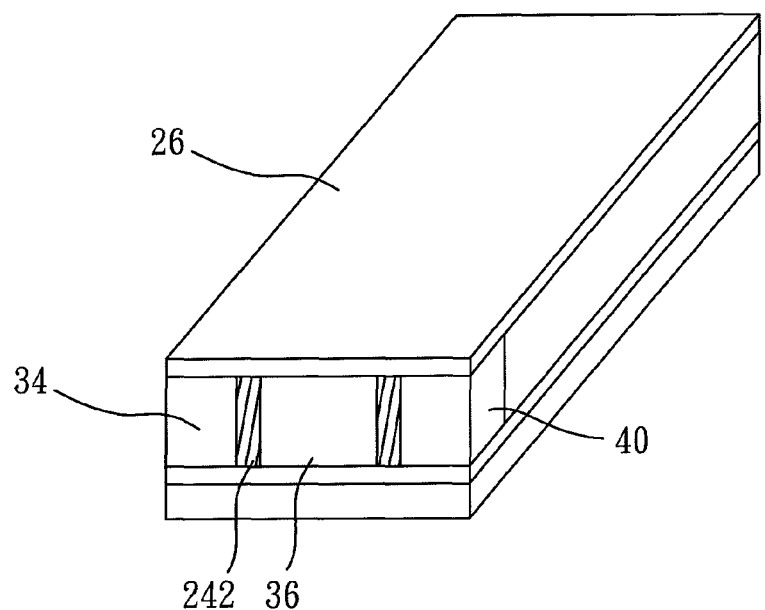

In Step S22, form two third lower dielectric layers 40 inside the two first openings 38, as shown in FIG. 4I. The third lower dielectric layers 40 are made of nitride or oxide. Similarly, the third lower dielectric layers 40 are flattened with a CMP method, as shown in FIG. 4J. In Step S24, form a resistive layer 26 over two first lower dielectric layers 34, two lower sub-electrodes 242, the second lower dielectric layer 36, and two third lower dielectric layers 40, as shown in FIG. 4K. The resistive layer 26 is made of a material selected from a group consisting of tungsten oxide ($WO_x$), hafnium oxide ($HfO_x$), titanium oxide ($TiO_x$), nickel oxide ($NiO_x$), aluminum oxide ($AlO_x$), zirconium oxide ($ZrO_x$), zinc oxide ($ZnO_x$), and copper oxide ($CuO_x$).

Figure 4L:
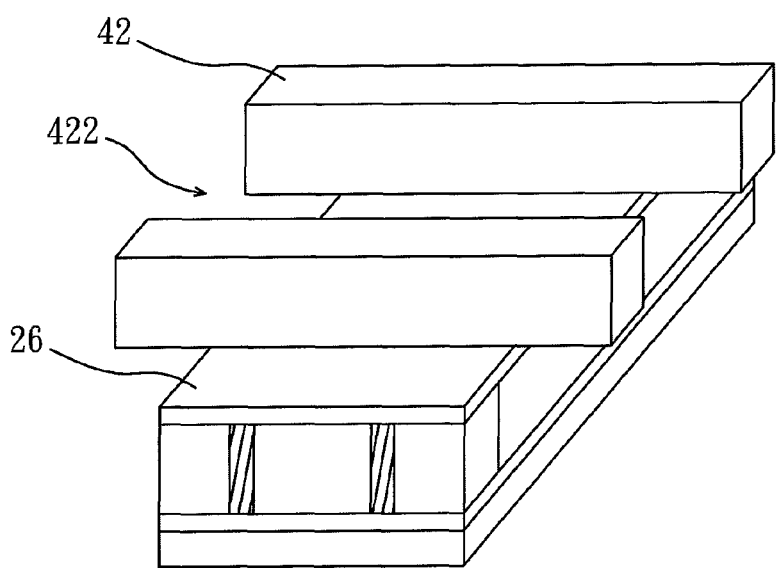
Figure 4M:
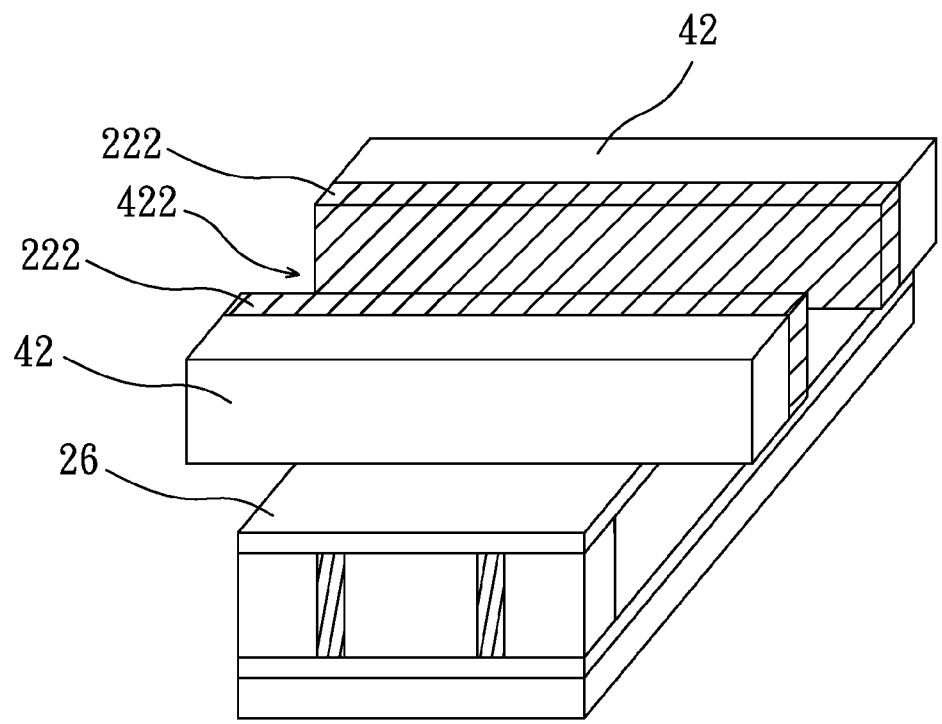
Figure 4N:
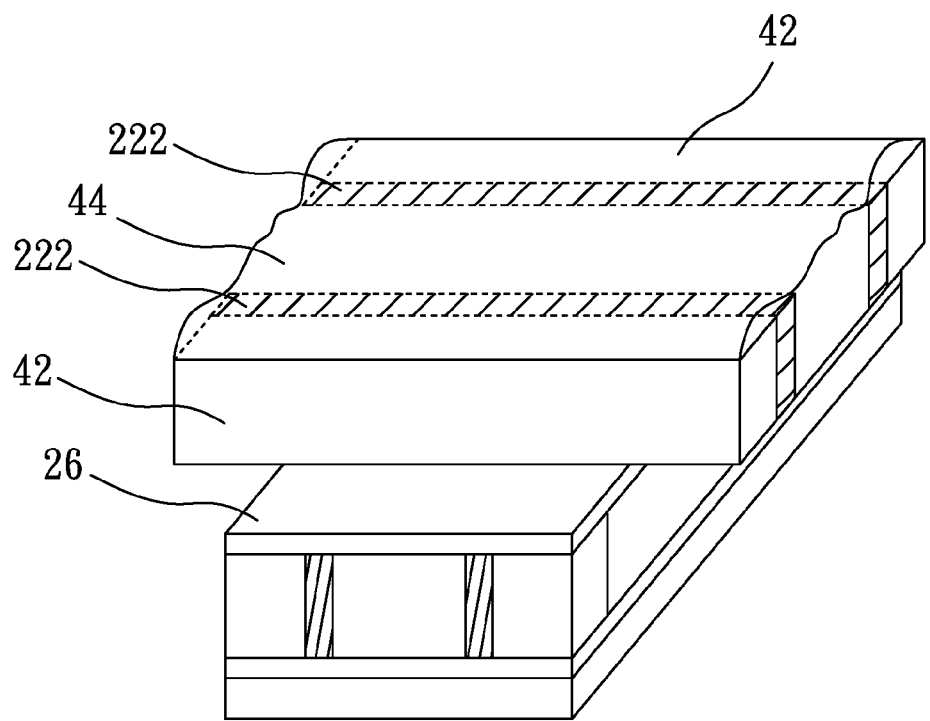
Figure 4O:
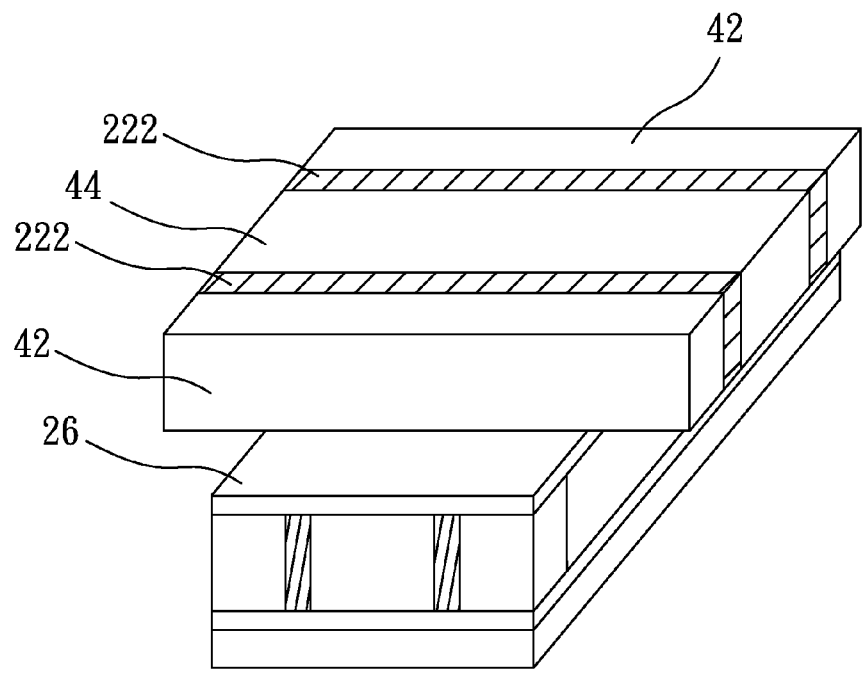
Figure 4P:
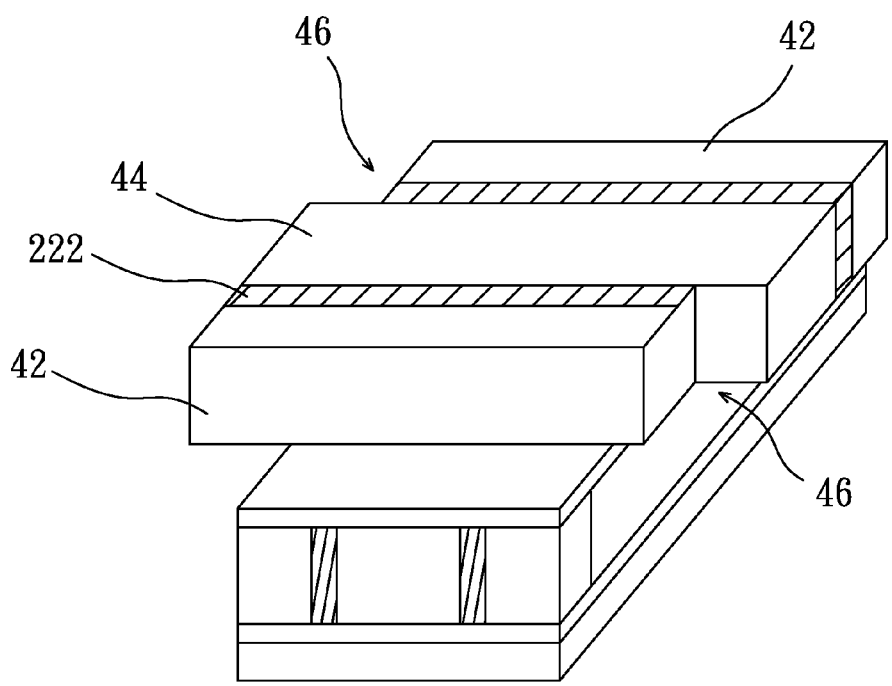

Next, an upper electrode 22 will be fabricated in the same way as the lower electrode 24. Note that the lower electrode 24 is arranged in the X-axis direction and the upper electrode 22 is arranged in the Y-axis direction. In other words, the upper electrode 22 intersects the lower electrode 24. In Step S26, form on the resistive layer 26 a complete layer of a first upper dielectric layer 42 (such a dielectric layer made of silicon nitride (SiN)), and use a photolithography-etching process to form a trench 422 in the middle of the first upper dielectric layer 42, whereby are generated two separate first upper dielectric layers 42 on the resistive layer 26, as shown in FIG. 4L. In Step S28, form a complete layer of an upper electrode 22 over the first upper dielectric layer 42 and the resistive layer 26 (including the resistive layer 26 inside the trench 422) with a CVD, PVD, or ALD method; use an RIE process together with chlorine, argon or hydrogen bromide to remove the upper electrode 22 on the first upper dielectric layer 22 and remove a portion of the upper electrode 22 inside the trench 422 to form two separate upper sub-electrodes 222 respectively on two sidewalls of the two separate first upper dielectric layers 42, as shown in FIG. 4M. The preferred width of the upper sub-electrode 222 is 1-10 nm. In Step S30, use a CVD method to form a second upper dielectric layer 44 over the resistive layer 26 inside the gap between the two upper sub-electrodes 222, as shown in FIG. 4N. The second upper dielectric layer 44 is made of silicon dioxide or silicon nitride. As shown in FIG. 4N, the as-deposited second upper dielectric layer 44 is rugged. Therefore, a CMP (Chemical Mechanical Polishing) method is used to flatten the as-deposited second upper dielectric layer 44 and make the top of the second upper dielectric layer 44 and the top of two upper sub-electrodes 222 on the same plane, as shown in FIG. 4O. In Step S32, use a photolithography-etching process to remove a portion of the two upper sub-electrodes 222 and a portion of the first upper dielectric layers 42 to form two second openings 46 respectively at two opposite ends of the second upper dielectric layers 44, as shown in FIG. 4P. Thereby, the two upper sub-electrodes 222 are disconnected electrically and can be controlled independently. The description of the abovementioned steps demonstrates that the present invention can fabricate two upper sub-electrodes 222 in a dimension of 1 F.

Figure 4Q:
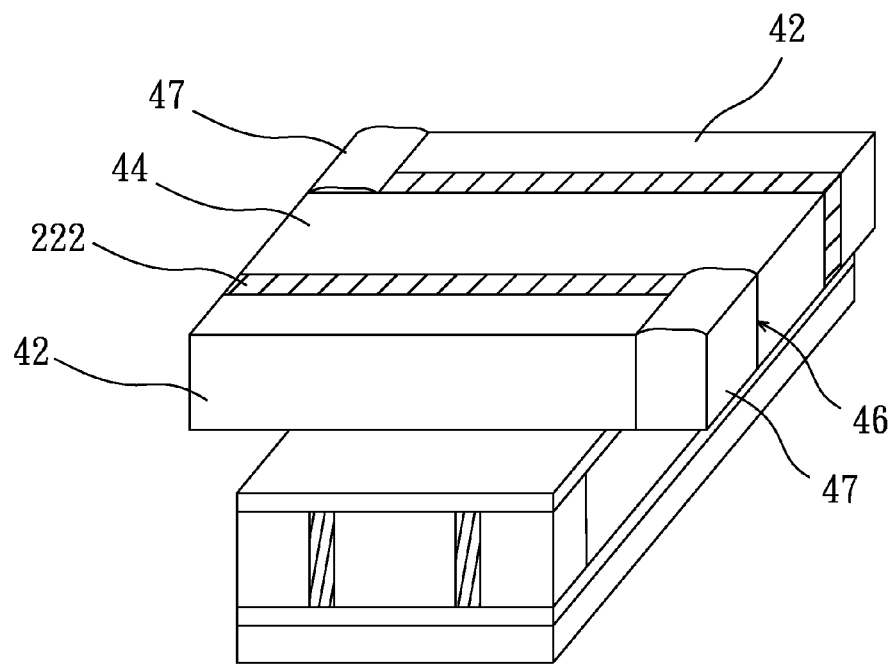

Via the abovementioned method, the original lower electrode 24 is fabricated into two lower sub-electrodes 242, and the original upper electrode 22 is fabricated into two upper sub-electrodes 222, whereby the capacity of a memory is quadrupled in an identical area. In Step S34, form two third upper dielectric layers 47 inside the two second openings 46, as shown in FIG. 4Q. The third upper dielectric layers 47 are made of nitride or oxide. Similarly, the third upper dielectric layers 47 are flattened with a CMP method, as shown in FIG. 4R. Step S12-Step S32 may be repeated to stack memory cells and increase memory capacity.

Figure 6:
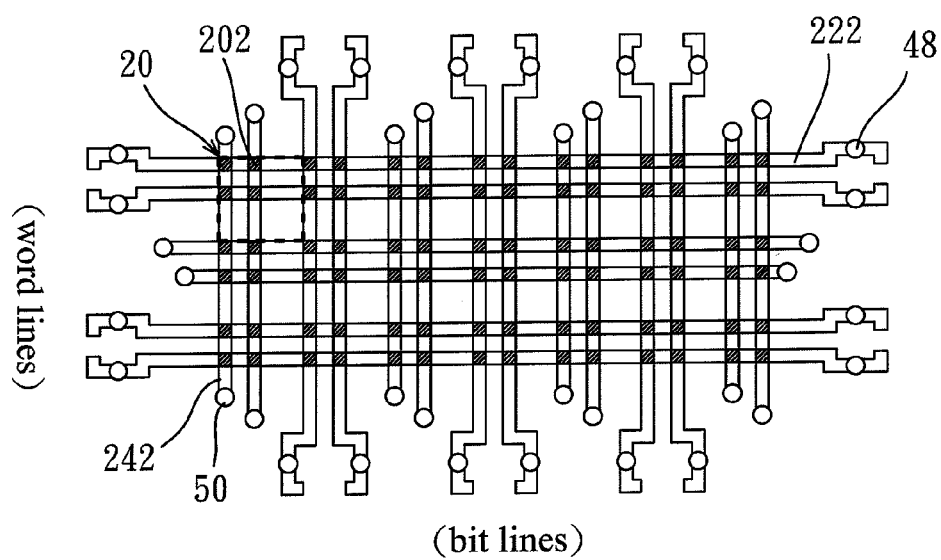
FIG. 6 schematically shows the external connections of the memory cells according to one embodiment of the present invention.

Refer to FIG. 3 and FIG. 6. FIG. 6 schematically shows the external connections of the memory cells. The two upper sub-electrodes 222 of each memory cell 20 function as word lines and respectively connect with upper electric contacts 48. Pairs of the upper electric contacts 48 are arranged intermittently. The two lower sub-electrodes 242 of each memory cell 20 function as bit lines and respectively connect with lower electric contacts 50. Pairs of the lower electric contacts 50 are arranged intermittently, too. Thus is effectively utilized the external connection area of the word lines and bit lines and achieved the optimal design of the sub-memory cells 202 and the ultra high density of the memory.

The embodiments described above are only to exemplify the present invention but not to limit the scope of the present invention. Any equivalent modification or variation according to the characteristics of spirit of the present invention is to be also included within the scope of the present invention.

What is claimed is:

1. A resistive memory structure comprising:
    a plurality of memory cells each including:
        a first coplanar structure comprising a lower electrode extending in a first direction having a first lower sub-electrode and a second lower sub-electrode, the first and second lower sub-electrodes being electrically separated from each other in a second direction orthogonal to said first direction, each of said first and second lower sub-electrodes being parallel and electrically disconnected by first and second dielectric components at opposite ends respectively and wherein said first and second dielectric components are arranged diagonally with respect to each other;
        a second coplanar structure comprising an upper electrode extending in said second direction having a first upper sub-electrode and a second upper sub-electrode, said first and second upper sub-electrodes being electrically separated from each other in said first direction, each of said first and second upper sub-electrodes being parallel and electrically disconnected by third and fourth dielectric components at opposite ends respectively and wherein said third and fourth dielectric components are arranged diagonally with respect to each other;
        a coplanar resistive layer formed between said first and second coplanar structures to enable intersections of said first and second upper sub-electrodes and said first and second lower sub-electrodes to function as four sub-memory cells.

2. The resistive memory structure according to claim 1 further comprising a substrate and a dielectric layer, wherein said dielectric layer, said lower electrode and said resistive layer and said upper electrode are formed over said substrate.

3. The resistive memory structure according to claim 2 further comprising at least two first upper dielectric layers and at least two first lower dielectric layers intersecting the at least two first upper dielectric layers, wherein said at least two first lower dielectric layers are formed over said dielectric layer, and wherein said first and second lower sub-electrodes are respectively formed on sidewalls of said at least two first lower dielectric layers, and wherein said first and second upper sub-electrodes are respectively formed on sidewalls of said at least two first upper dielectric layers.

4. The resistive memory structure according to claim 3 further comprising a second upper dielectric layer and a second lower dielectric layer, wherein said second lower dielectric layer is formed over said dielectric layer, and wherein said second upper dielectric layer and said second lower dielectric layer are respectively arranged in a gap between said first and second upper sub-electrodes and a gap between said first and second lower sub-electrodes.

5. The resistive memory structure according to claim 1, wherein said first and second upper sub-electrodes are respectively connected with two upper electric contacts, and wherein pairs of said upper electric contacts are arranged intermittently, and wherein said first and second lower sub-electrodes are respectively connected with two lower electric contacts, and wherein pairs of said lower electric contacts are arranged intermittently.

6. The resistive memory structure according to claim 1, wherein said resistive layer is made of a material selected from a group consisting of tungsten oxide, hafnium oxide, titanium oxide, nickel oxide, aluminum oxide, zirconium oxide, zinc oxide, and copper oxide ($CuO_x$).

7. A resistive memory structure comprising
a substrate;
a dielectric layer formed on said substrate; and
a plurality of memory cells formed on said dielectric layer, the plurality of memory cells each including:
a first coplanar structure comprising a lower electrode extending in a first direction having a first lower sub-electrode and a second lower sub-electrode, the first and second lower sub-electrodes being electrically separated from each other in a second direction orthogonal to said first direction, each of said first and second lower sub-electrodes being parallel and electrically disconnected by first and second dielectric components at opposite ends respectively and wherein said first and second dielectric components are arranged diagonally with respect to each other;
a second coplanar structure comprising an upper electrode extending in said second direction having a first upper sub-electrode and a second upper sub-electrode, said first and second upper sub-electrodes being electrically separated from each other in said first direction, each of said first and second upper sub-electrodes being parallel and electrically disconnected by third and fourth dielectric components at opposite ends respectively and wherein said third and fourth dielectric components are arranged diagonally with respect to each other;
a coplanar resistive layer formed between said first and second coplanar structures to enable intersections of said first and second upper sub-electrodes and said first and second lower sub-electrodes to function as four sub-memory cells.

8. The resistive memory structure according to claim 7, further comprising at least two first upper dielectric layers and at least two first lower dielectric layers intersecting the at least two first upper dielectric layers, wherein said at least two first lower dielectric layers are formed over said dielectric layer, and wherein said first and second lower sub-electrodes are respectively formed on sidewalls of said at least two first lower dielectric layers, and wherein said first and second upper sub-electrodes are respectively formed on sidewalls of said at least two first upper dielectric layers.

9. The resistive memory structure according to claim 8, further comprising a second upper dielectric layer and a second lower dielectric layer, wherein said second lower dielectric layer is formed over said dielectric layer, and wherein said second upper dielectric layer and said second lower dielectric layer are respectively arranged in a gap between said first and second upper sub-electrodes and a gap between said first and second lower sub-electrodes.

10. The resistive memory structure according to claim 7, wherein said first and second upper sub-electrodes are respectively connected with two upper electric contacts, and wherein pairs of said upper electric contacts are arranged intermittently, and wherein said first and second lower sub-electrodes are respectively connected with two lower electric contacts, and wherein pairs of said lower electric contacts are arranged intermittently.

11. The resistive memory structure according to claim 7, wherein said resistive layer is made of a material selected from a group consisting of tungsten oxide, hafnium oxide, titanium oxide, nickel oxide, aluminum oxide, zirconium oxide, zinc oxide, and copper oxide ($CuO_x$).

12. A resistive memory structure comprising:
a plurality of memory cells each including:
a first coplanar structure comprising a lower electrode extending in a first direction having a first lower sub-electrode and a second lower sub-electrode, the first and second lower sub-electrodes being electrically separated from each other in a second direction orthogonal to said first direction, each of said first and second lower sub-electrodes being parallel and electrically disconnected by first and second dielectric components at opposite ends respectively and wherein said first and second dielectric components are arranged diagonally with respect to each other; wherein said first and second lower sub-electrodes are respectively connected with two lower electric contacts;
a second coplanar structure comprising an upper electrode extending in said second direction having a first upper sub-electrode and a second upper sub-electrode, said first and second upper sub-electrodes being electrically separated from each other in said first direction, each of said first and second upper sub-electrodes being parallel and electrically disconnected by third and fourth dielectric components at opposite ends respectively and wherein said third and fourth dielectric components are arranged diagonally with respect to each other; wherein said first and second upper sub-electrodes are respectively connected with two upper electric contacts; and
a coplanar resistive layer formed between said first and second coplanar structures to enable intersections of said first and second upper sub-electrodes and said first and second lower sub-electrodes to function as four sub-memory cells.

13. The resistive memory structure according to claim 12, further comprising a substrate and a dielectric layer, wherein said dielectric layer, said lower electrode and said resistive layer and said upper electrode are formed over said substrate.

14. The resistive memory structure according to claim 13, further comprising at least two first upper dielectric layers and at least two first lower dielectric layers intersecting the at least two first upper dielectric layers, wherein said at least two first lower dielectric layers are formed over said dielectric layer, and wherein said first and second lower sub-electrodes are respectively formed on sidewalls of said at least two first lower dielectric layers, and wherein said first and second upper sub-electrodes are respectively formed on sidewalls of said at least two first upper dielectric layers.

15. The resistive memory structure according to claim 14, further comprising a second upper dielectric layer and a second lower dielectric layer, wherein said second lower dielectric layer is formed over said dielectric layer, and wherein said second upper dielectric layer and said second lower dielectric layer are respectively arranged in a gap between said first and second upper sub-electrodes and a gap between said first and second lower sub-electrodes.

16. The resistive memory structure according to claim 12, wherein said resistive layer is made of a material selected from a group consisting of tungsten oxide, hafnium oxide, titanium oxide, nickel oxide, aluminum oxide, zirconium oxide, zinc oxide, and copper oxide ($CuO_x$).

* * * * *